(12) United States Patent
Reznicek et al.

(10) Patent No.: US 10,741,492 B2
(45) Date of Patent: Aug. 11, 2020

(54) FINFET FUSES FORMED AT TIGHT PITCH DIMENSIONS

(71) Applicant: International Business Machines Corporation, Armonk, NY (US)

(72) Inventors: Alexander Reznicek, Troy, NY (US); Oscar van der Straten, Guilderland Center, NY (US); Praneet Adusumilli, Somerset, NJ (US); Bahman Hekmatshoartabari, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/588,254

(22) Filed: Sep. 30, 2019

(65) Prior Publication Data

US 2020/0027831 A1    Jan. 23, 2020

Related U.S. Application Data

(62) Division of application No. 15/836,339, filed on Dec. 8, 2017, now Pat. No. 10,573,596.

(51) Int. Cl.
*H01L 23/525* (2006.01)
*H01L 21/308* (2006.01)
*H01L 21/66* (2006.01)
*H01L 23/62* (2006.01)
(Continued)

(52) U.S. Cl.
CPC ...... *H01L 23/5256* (2013.01); *H01L 21/3086* (2013.01); *H01L 21/823821* (2013.01); *H01L 22/22* (2013.01); *H01L 23/5252* (2013.01); *H01L 23/5254* (2013.01); *H01L 23/5258* (2013.01); *H01L 23/62* (2013.01); *H01L 27/0617* (2013.01)

(58) Field of Classification Search
CPC ......... H01L 23/525–5258; H01L 23/62; H01L 22/22; H01L 21/3086
See application file for complete search history.

(56) References Cited

U.S. PATENT DOCUMENTS

| 8,400,813 | B2 | 3/2013 | Lee |
| 8,471,296 | B2 | 6/2013 | Cheng et al. |
| 8,750,069 | B2 | 6/2014 | Kim |

(Continued)

OTHER PUBLICATIONS

Chang, et al., "Chemical and Plasma Oxidation Behaviors of NiSi and NiPtSi Salicide Films in 65nm Node CMOS Process", International Interconnect Technology Conference, IEEE, Date of Conference: Jun. 4-6, 2007, pp. 99-101, Conference Location: Burlingame, CA, USA.

(Continued)

*Primary Examiner* — Bac H Au
(74) *Attorney, Agent, or Firm* — Scully, Scott, Murphy & Presser, P.C.; L. Jeffrey Kelly, Esq.

(57) ABSTRACT

A semiconductor structure is provided in which metal semiconductor alloy pillars are formed at least partially within the sidewall surfaces of each semiconductor fin that extends from a surface of a substrate. These pillars are fuses (i.e., FinFET fuses) that are formed at a very tight pitch dimensions. The pillars can be trimmed after forming FinFET devices. The present application provides a method for forming on-chip FinFET fuses easily by choice of the metal semiconductor alloy, the amount of pillar trim, the number of contacted pillars and to a lower design degree the height of each pillar.

20 Claims, 14 Drawing Sheets

(51) Int. Cl.
    *H01L 21/8238*    (2006.01)
    *H01L 27/06*      (2006.01)

(56) References Cited

U.S. PATENT DOCUMENTS

| | | |
|---|---|---|
| 8,848,423 B2 | 9/2014 | Chung |
| 9,093,530 B2 | 7/2015 | Huang et al. |
| 9,755,016 B2 | 9/2017 | Choi et al. |
| 9,893,014 B1 | 2/2018 | Fogel et al. |
| 9,917,090 B1 | 3/2018 | Cheng et al. |
| 10,319,677 B2 | 6/2019 | Cheng et al. |
| 2019/0139892 A1 | 5/2019 | Wong et al. |

OTHER PUBLICATIONS

List of IBM Patents or Patent Applications Treated as Related dated Sep. 30, 2019, 2 pages.

FINFET FUSES FORMED AT TIGHT PITCH DIMENSIONS

BACKGROUND

The present application relates to a semiconductor structure and a method of forming the same. More particularly, the present application relates to a semiconductor structure including fuses that are formed during a FinFET CMOS process, which fuses can be readily tuned, while not requiring excess footprint/spacing.

In addition to transistors, resistors, capacitors, and diodes, semiconductor devices also often contain fuses. These fuses may be used for several purposes. For example, fuses may be used within semiconductor devices for purposes of introducing or deleting customized circuit elements into a semiconductor device. In addition, fuses within semiconductor devices may be used for purposes of severing a non-operative portion of the semiconductor device and replacing that non-operative portion with a redundant semiconductor device fabricated on the same semiconductor substrate. Fuses may also be used to provide direct alternative current (DAC) trimming.

It is highly desired to fabricate on-chip fuses during FinFET CMOS fabrication so as to minimize processing cost and improve system integration. Fuses that are formed during the FinFET CMOS fabrication process are referred to as FinFET fuses. Tuning the FinFET fuse size accurately to the application is highly desired. Also, saving footprint/spacing while providing desired FinFET fuses is an additional requirement. There is thus a need for providing FinFET fuses which can be easily tuned for a desired application, and which do not take up too much space.

SUMMARY

A semiconductor structure is provided in which metal semiconductor alloy pillars are formed at least partially within the sidewall surfaces of each semiconductor fin that extends from a surface of a substrate. These pillars are fuses (i.e., FinFET fuses) that are formed at a very tight pitch dimensions. By "very tight pitch dimensions" it is meant a pitch from 5 nm to 50 nm. The pillars can be trimmed after forming FinFET devices. The present application provides a method for forming on-chip FinFET fuses easily by choice of the metal semiconductor alloy, the amount of pillar trim, the number of contacted pillars and, to a lower design degree, the height of each pillar.

In one aspect of the present application, a semiconductor structure is provided. In one embodiment, the semiconductor structure may include a set of spaced apart first and second fuses present partially on a semiconductor fin pedestal and partially on an isolation layer that is laterally adjacent the semiconductor fin pedestal. Each of the first and second fuses comprises a metal semiconductor alloy pillar having a first end portion and a second end portion having a first thickness, and a middle portion located between the first and second end portions and having a second thickness that is less than the first thickness. A first contact structure is contacting a surface of the first end portion of each metal semiconductor alloy pillar of the set of spaced apart first and second fuses, and a second contact structure is contacting a surface of the second end portion of each metal semiconductor alloy pillar of the set of spaced apart first and second fuses.

In another aspect of the present application, a method of forming a semiconductor structure is provided. In one embodiment, the method may include providing at least one semiconductor fin extending upward from a semiconductor substrate, wherein the at least one semiconductor fin has a hard mask cap located on a surface thereof. Next, an isolation layer is formed on a physically exposed surface of the substrate and contacting opposing sidewall surfaces of a lower portion of the at least one semiconductor fin. A metal semiconductor alloy pillar is then formed within a portion of each of the opposing sidewall surfaces of the at least one semiconductor fin, wherein a semiconductor fin portion remains between each metal semiconductor alloy pillar. Next, the hard mask cap and the semiconductor fin portion are removed. A sacrificial gate structure and a gate spacer are then formed on each metal semiconductor alloy pillar, and an interlayer dielectric material layer is formed laterally surrounding the gate spacer. The sacrificial gate structure is then removed to provide a cavity that physically exposes a portion of each metal semiconductor alloy pillar, and thereafter the physically exposed portion of each metal semiconductor alloy pillar is trimmed to provide a pair of spaced apart fuses, each fuse having a first end portion and a second end portion having a first thickness, and a middle portion located between the first and second end portions and having a second thickness that is less than the first thickness.

DETAILED DESCRIPTION

Figure 1:
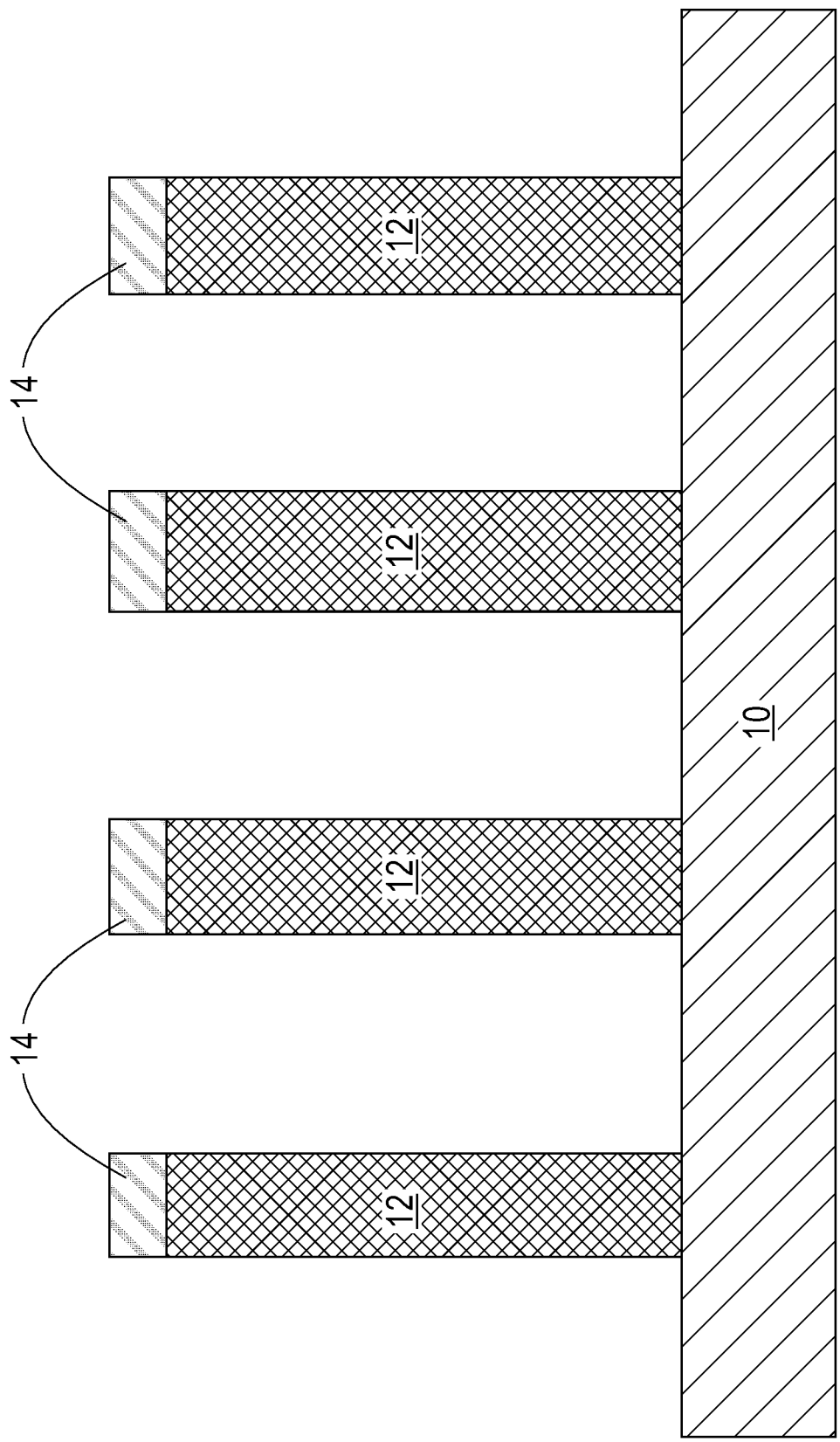
FIG. 1 is a cross sectional view of an exemplary semiconductor structure that can be employed in accordance with an embodiment of the present application and including a plurality of semiconductor fins extending upwards from a surface of a semiconductor substrate, wherein a hard mask cap is present on each semiconductor fin.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in accordance with an embodiment of the present application. The exemplary semiconductor structure of FIG. 1 includes a plurality of semiconductor fins 12 extending upwards from a surface of a semiconductor substrate 10, wherein a hard mask cap 14 is present on each semiconductor fin 12. Each hard mask cap 14 has sidewall surfaces that are vertically aligned to sidewall surfaces of an underlying semiconductor fin 12. The number of semiconductor fins 12 that are present on the semiconductor substrate 10 may vary so long as at least one semiconductor fin 12 is present.

The exemplary semiconductor structure of FIG. 1 can be formed by first providing a hard mask layer on a surface of a bulk semiconductor substrate. By "bulk" it is meant that the substrate is entirely composed of at least one semiconductor material having semiconducting properties. Examples of semiconductor materials that may provide the bulk semiconductor substrate include silicon (Si), germanium (Ge), silicon germanium alloys (SiGe), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one example, the bulk semiconductor substrate may be entirely composed of silicon. In some embodiments, the bulk semiconductor substrate may include a multilayered semiconductor material stack including at least two different semiconductor materials, as defined above. In one example, the multilayered semiconductor material stack may comprise, in any order, a stack of Si and a silicon germanium alloy.

The semiconductor material that provides the bulk semiconductor substrate may be a single crystalline semiconductor material. The semiconductor material that provides the bulk semiconductor substrate may have any of the well known crystal orientations. For example, the crystal orientation of the bulk semiconductor substrate may be {100}, {110}, or {111}. Other crystallographic orientations besides those specifically mentioned can also be used in the present application.

Hard mask layer is then formed on the bulk semiconductor substrate. The hard mask layer includes at least one hard mask material such as, for example, silicon dioxide, silicon nitride, and/or silicon oxynitride. The hard mask layer can be formed utilizing a conventional deposition process such as, for example, chemical vapor deposition or plasma enhanced chemical vapor deposition. The hard mask layer can have a thickness from 5 nm to 20 nm. Other thicknesses that are lesser than, or greater than, the aforementioned thickness range can also be employed as the thickness of the material that provides the hard mask layer.

The hard mask layer and an upper portion of the bulk semiconductor substrate are then patterned to provide the exemplary structure shown in FIG. 1. The patterning includes removing portions of the hard mask layer and upper portions of the bulk semiconductor substrate that are not protected during the patterning process. The portions of the hard mask layer that remain after the patterning process constitute the hard mask caps 14, the upper portions of the bulk semiconductor substrate that remain after the patterning process constituent the semiconductor fins 12 and a lower portion of the bulk semiconductor substrate that remains after the patterning process constitutes semiconductor substrate 10. A material interface may, or may not, be present between each semiconductor fin 12 and the semiconductor substrate 10.

In one embodiment, patterning may include lithography and etching. The lithographic process includes forming a photoresist (not shown) atop a material or material stack to be patterned, exposing the photoresist to a desired pattern of radiation and developing the exposed photoresist utilizing a conventional resist developer. The photoresist may be a positive-tone photoresist, a negative-tone photoresist or a hybrid-tone photoresist. The photoresist may be formed utilizing a deposition process such as, for example, spin-on coating. The etching process includes a dry etching process (such as, for example, reactive ion etching, ion beam etching, plasma etching or laser ablation), and/or a wet chemical etching process. Typically, reactive ion etching is used.

In another embodiment, patterning may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet a further embodiment, the patterning of the hard mask layer and the bulk semiconductor substrate may include a direct self-assembly (DSA) process in which a copolymer that is capable of direct self-assembly is used.

As used herein, a "semiconductor fin" refers to a semiconductor material that includes a pair of vertical sidewalls that are parallel to each other. As used herein, a surface is "vertical" if there exists a vertical plane from which the surface does not deviate by more than three times the root mean square roughness of the surface. In one embodiment, each semiconductor fin 12 has a height from 20 nm to 250 nm, and a width from 5 nm to 30 nm. Other heights and/or widths that are lesser than, or greater than, the ranges mentioned herein can also be used in the present application. Each semiconductor fin 12 is spaced apart from its nearest neighboring semiconductor fin 12 by a pitch of from 20 nm to 100 nm; the pitch is measured from one point of one structure, e.g., semiconductor fin, to the exact point on a neighboring structure, e.g., semiconductor fin. Also, each semiconductor fin 12 is oriented parallel to each other. An opening or gap is present between each neighboring pairs of semiconductor fins 12.

Figure 2:
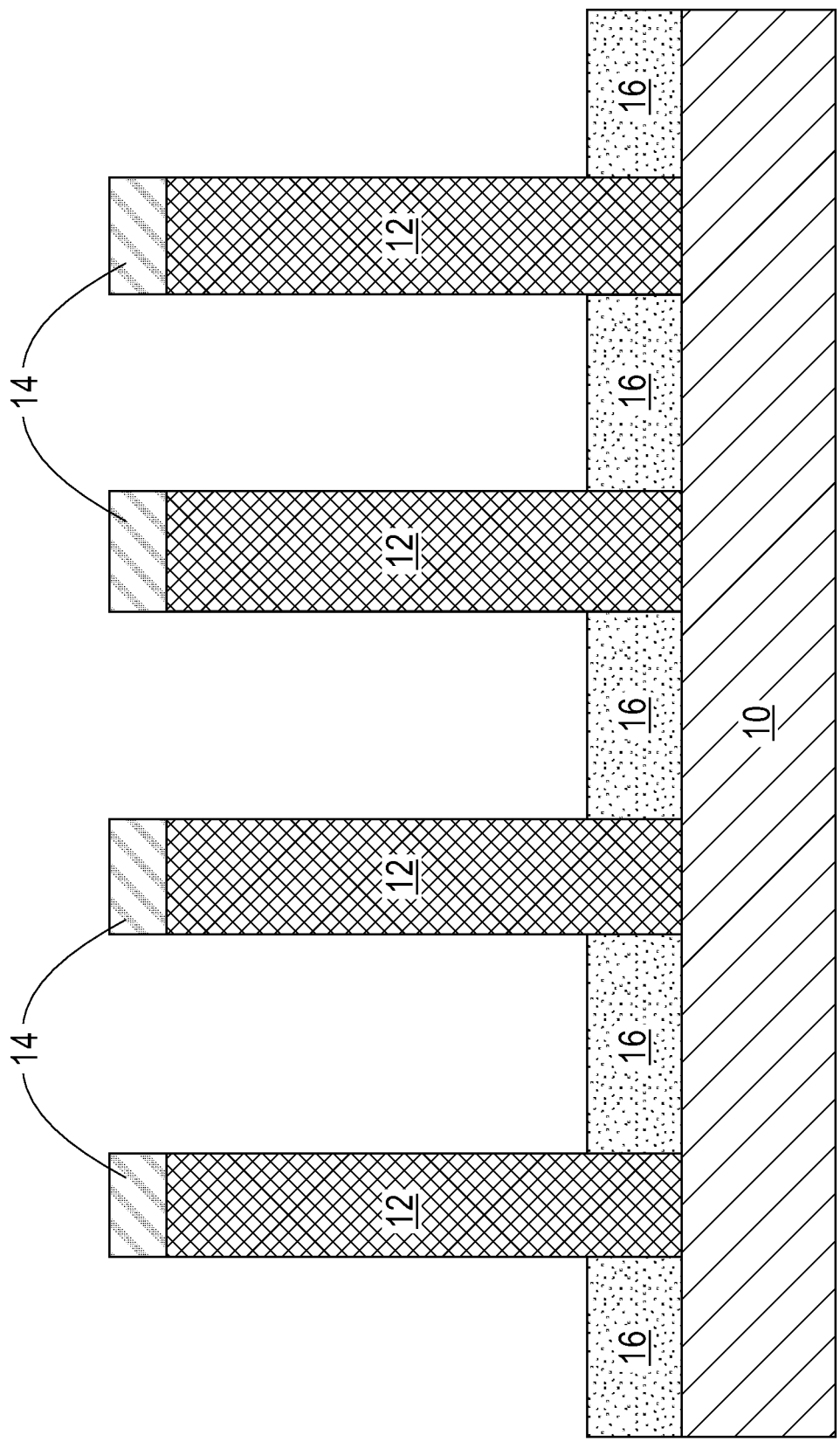
FIG. 2 is a cross sectional view of the exemplary semiconductor structure of FIG. 1 after forming an isolation layer on the physically exposed surfaces of the semiconductor substrate and contacting sidewall surfaces of a lower portion of each semiconductor fin.

Referring now to FIG. 2, there is illustrated the exemplary semiconductor structure of FIG. 1 after forming an isolation layer 16 on the physically exposed surfaces of the semiconductor substrate 10 and contacting sidewall surfaces of a lower portion of each semiconductor fin 12.

Isolation layer 16 may include a dielectric material such as, for example, silicon dioxide, silicon nitride, and/or silicon oxynitride. The dielectric material that provides the isolation layer 16 is different from the hard mask material that provides each hard mask cap 14. For example, the isolation layer 16 may be composed of silicon dioxide, while the hard mask caps 14 may be composed of silicon nitride. Isolation layer 16 can be formed utilizing a deposition process such as, for example, chemical vapor deposition or plasma enhanced chemical vapor deposition. A recess etch typically follows the deposition of the dielectric material that provides the isolation layer 16. In some embodiments, and prior to performing the recess etch, a planarization process such as, for example, chemical mechanical polishing may be used. The isolation layer 16 typically has thickness from 5 nm to 20 nm.

Figure 3:
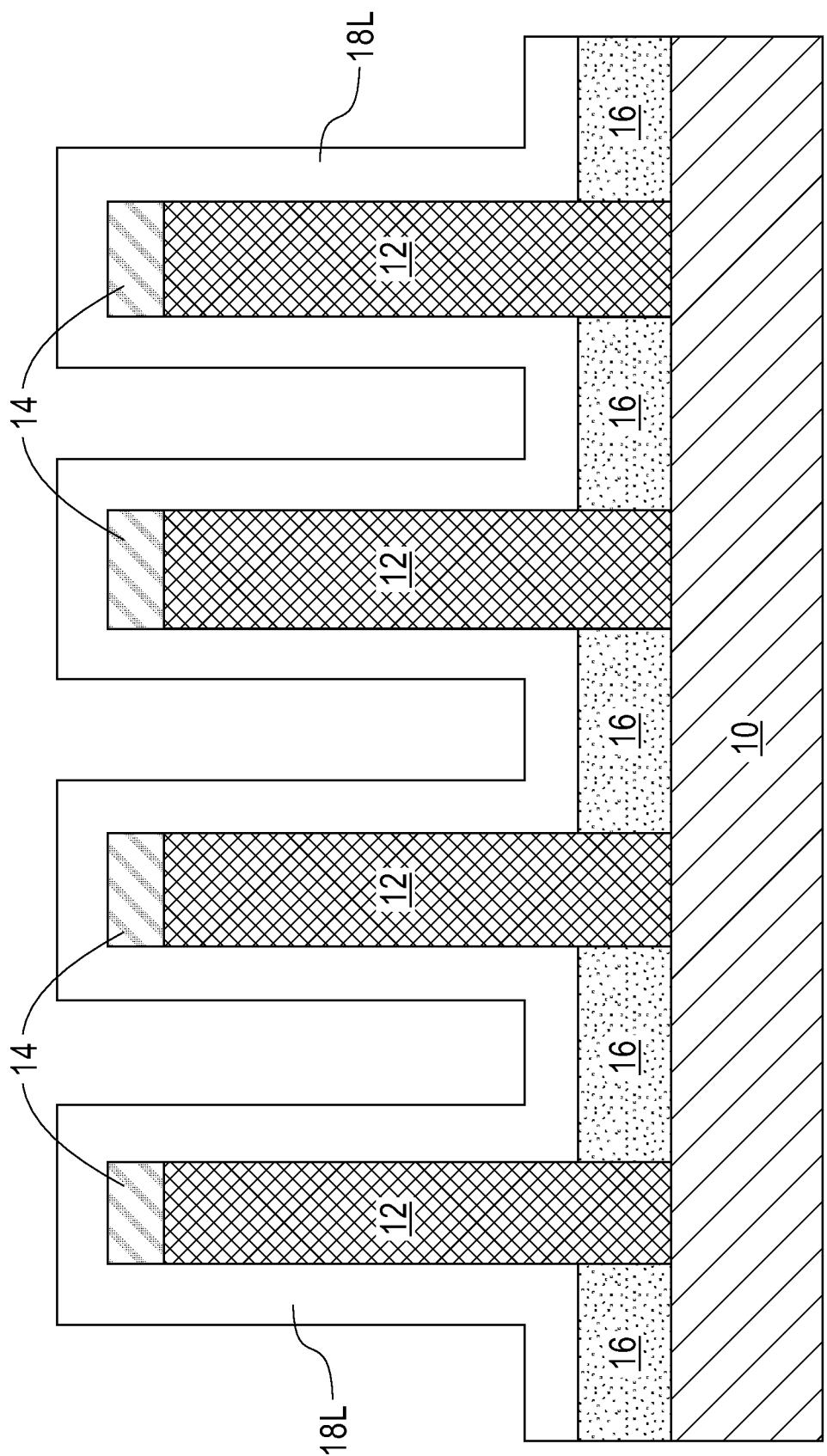
FIG. 3 is a cross sectional view of the exemplary semiconductor structure of FIG. 2 after forming a metal semiconductor alloy forming metal layer.

Referring now to FIG. 3, there is illustrated the exemplary semiconductor structure of FIG. 2 after forming a metal semiconductor alloy forming metal layer 18L. The term "metal semiconductor alloy forming metal" is used throughout the present application to denote a metal that can react with the physically exposed sidewall surfaces of each semiconductor fin 12 to form a metal semiconductor alloy pillar at least partially within each side of the semiconductor fin 12 during a subsequently performed anneal. Illustrative examples of metal semiconductor alloy forming metals that can be used as the metal semiconductor alloy forming metal layer 18L include at least one of nickel (Ni), platinum (Pt), palladium (Pd), titanium (Ti), tungsten (W), and cobalt (Co). The metal semiconductor alloy forming metal layer 18L can be formed by a deposition process including, for example, chemical vapor deposition (CVD), plasma enhanced chemical vapor deposition (PECVD), physical vapor deposition (PVD) or sputtering. In some embodiments, a co-deposition of metal semiconductor alloy forming metals can be used. In another embodiment, a first metal semiconductor alloy forming metal can be formed, followed by a second metal semiconductor alloy forming metal. The metal semiconductor alloy forming metal layer 18L that is formed can have a thickness from 5 nm to 15 nm. Other thicknesses that are greater than or lesser than the aforementioned thickness range can also be employed as the thickness of the metal semiconductor alloy forming metal layer 18L.

Figure 4:
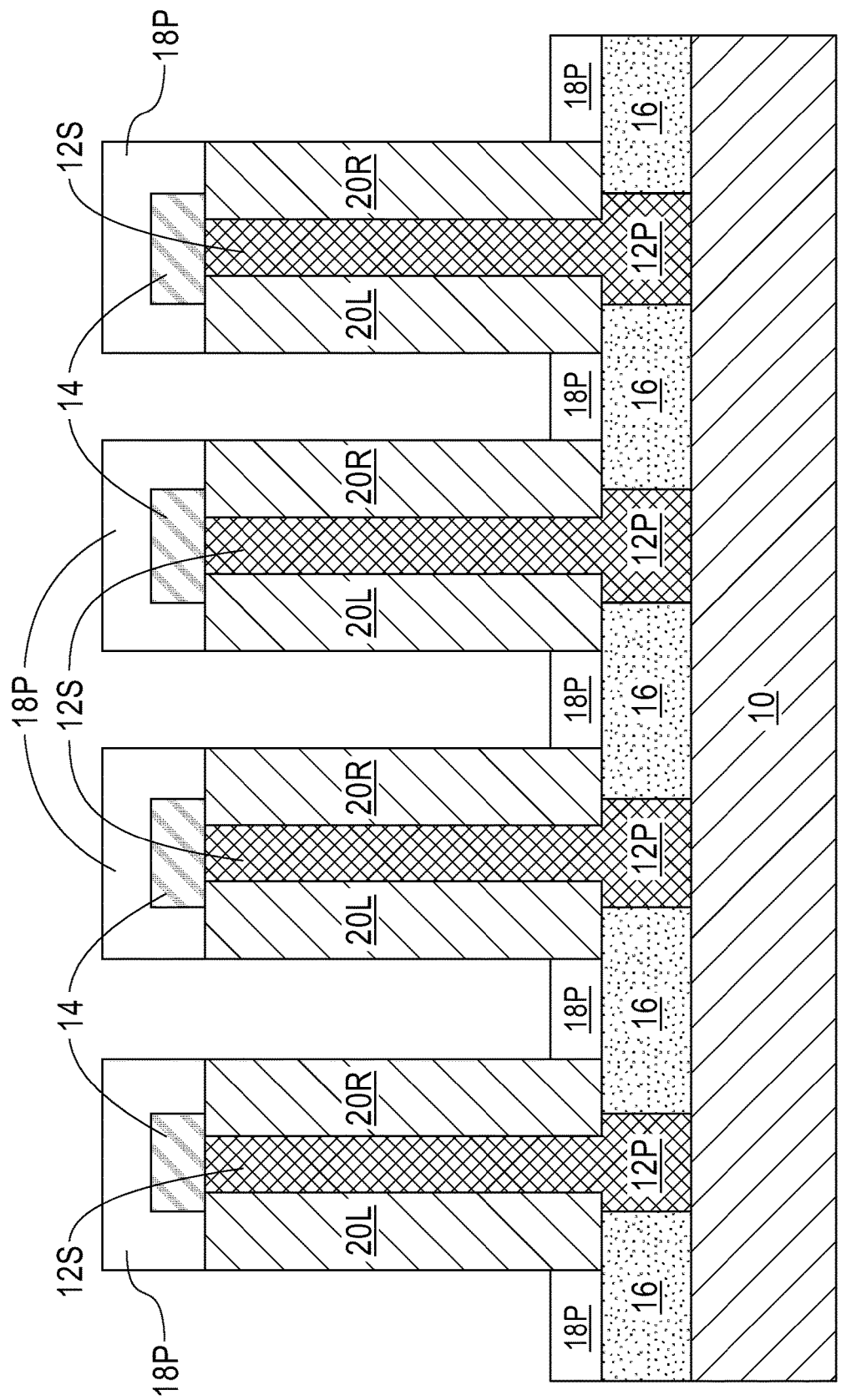
FIG. 4 is a cross sectional view of the exemplary semiconductor structure of FIG. 3 after performing an anneal to form metal semiconductor alloy pillars at least partially within opposing sidewall surfaces of each semiconductor fin, wherein a semiconductor fin portion remains between the metal semiconductor alloy pillars.

Referring now to FIG. 4, there is illustrated the exemplary semiconductor structure of FIG. 3 after performing an anneal to form metal semiconductor alloy pillars 20L, 20R within at least a portion of opposing sidewall surfaces of each semiconductor fin 12. In accordance with the present application, a semiconductor fin portion 12S remains between the metal semiconductor alloy pillars 20L, 20R that are formed. Also, and as shown in the drawings, each semiconductor fin portion 12S is present upon a semiconductor fin pedestal 12P. The semiconductor pedestals comprise a lower portion of the semiconductor fins 12 which is laterally surrounded by isolation layer 16. Each semiconductor fin pedestal 12P has a first width that is the same as the width of the original fin 12, while each semiconductor fin portion 12S has a second width that is less than the first width as well as the width of the original semiconductor fin 12.

The anneal is performed under conditions that are effective in causing the metal of the metal semiconductor alloy forming metal layer 18L that is in direct physically contact with the sidewall surfaces of each semiconductor fin 12 to diffuse into the sidewall surfaces of each semiconductor fin 12 and to react with the semiconductor material of the semiconductor fin 12 forming the metal semiconductor alloy pillars 20L, 20R. Each metal semiconductor alloy pillar 20L, 20R is thus composed of reaction product that is formed by reacting the metal of the metal semiconductor alloy forming metal layer 18L with the semiconductor material of the semiconductor fins 12. For example, each metal semiconductor alloy pillar 20L, 20R may be composed of a metal silicide or metal germanide. It is noted that portions of the metal semiconductor alloy forming metal layer 18L that are not in direct physically contact with the sidewall surfaces of the semiconductor fins 12 are not converted into a metal semiconductor alloy. Instead, and as shown in FIG. 4, metal semiconductor alloy forming metal portions 18P remain in the structure. Each pair of metal semiconductor alloy pillars 20L, 20R constitutes a set of spaced pillars that can be used in providing a set of first and second fuses.

The anneal may be performed in a single step or a two-step anneal can be used. In one embodiment and when nickel is used, the anneal can be performed at a temperature of from 200° C. to 500° C. In another embodiment, temperatures greater than 500° C. can be used. The anneal is typically performed in an inert ambient including, for example, argon, helium, neon and/or nitrogen. The anneal can be performed utilizing a rapid thermal anneal, a spike anneal, a microwave anneal or a laser anneal.

Each metal semiconductor alloy pillar 20L that is located on one side of the semiconductor fin portion 12S is separated from its corresponding metal semiconductor alloy pillar 20R that is located on an opposing side of the semiconductor fin portion 12S by a pitch that is from 5 nm to 50 nm. Each metal semiconductor alloy pillar 20L, 20R has a height that is less than the original semiconductor fins 12. In one example, each metal semiconductor alloy pillar 20L, 20R has a height from 20 nm to 200 nm.

Figure 5:
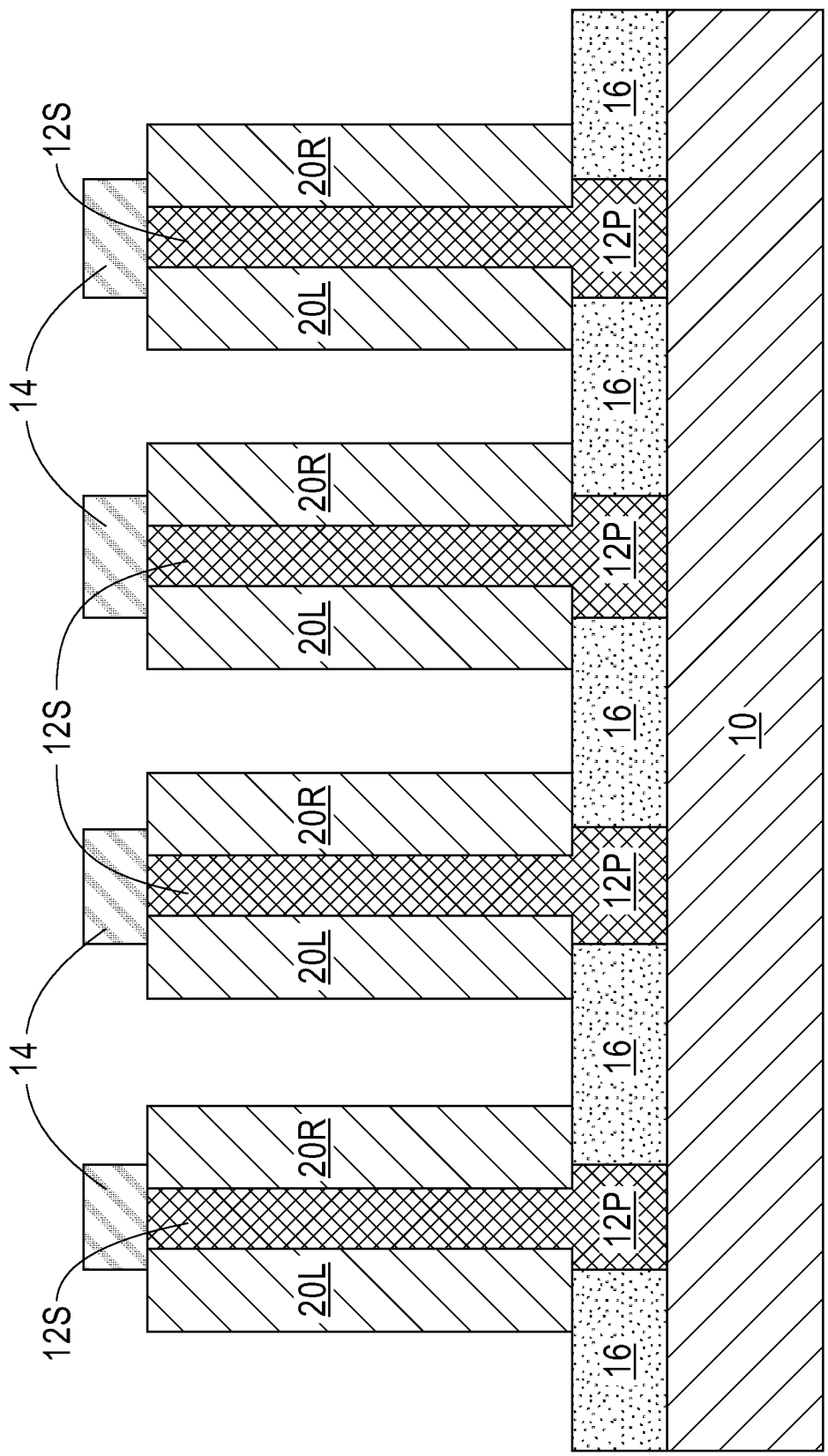
FIG. 5 is a cross sectional view of the exemplary semiconductor structure of FIG. 4 after removing unreacted metal semiconductor alloy forming metal portions.

Referring now to FIG. 5, there is illustrated the exemplary semiconductor structure of FIG. 4 after removing the unreacted metal semiconductor alloy forming metal portions 18P from the structure. The unreacted metal semiconductor alloy forming metal portions 18P can be removed utilizing an etchant that is selective in removing the unreacted metal semiconductor alloy forming metal portions 18P from the structure.

Figure 6:
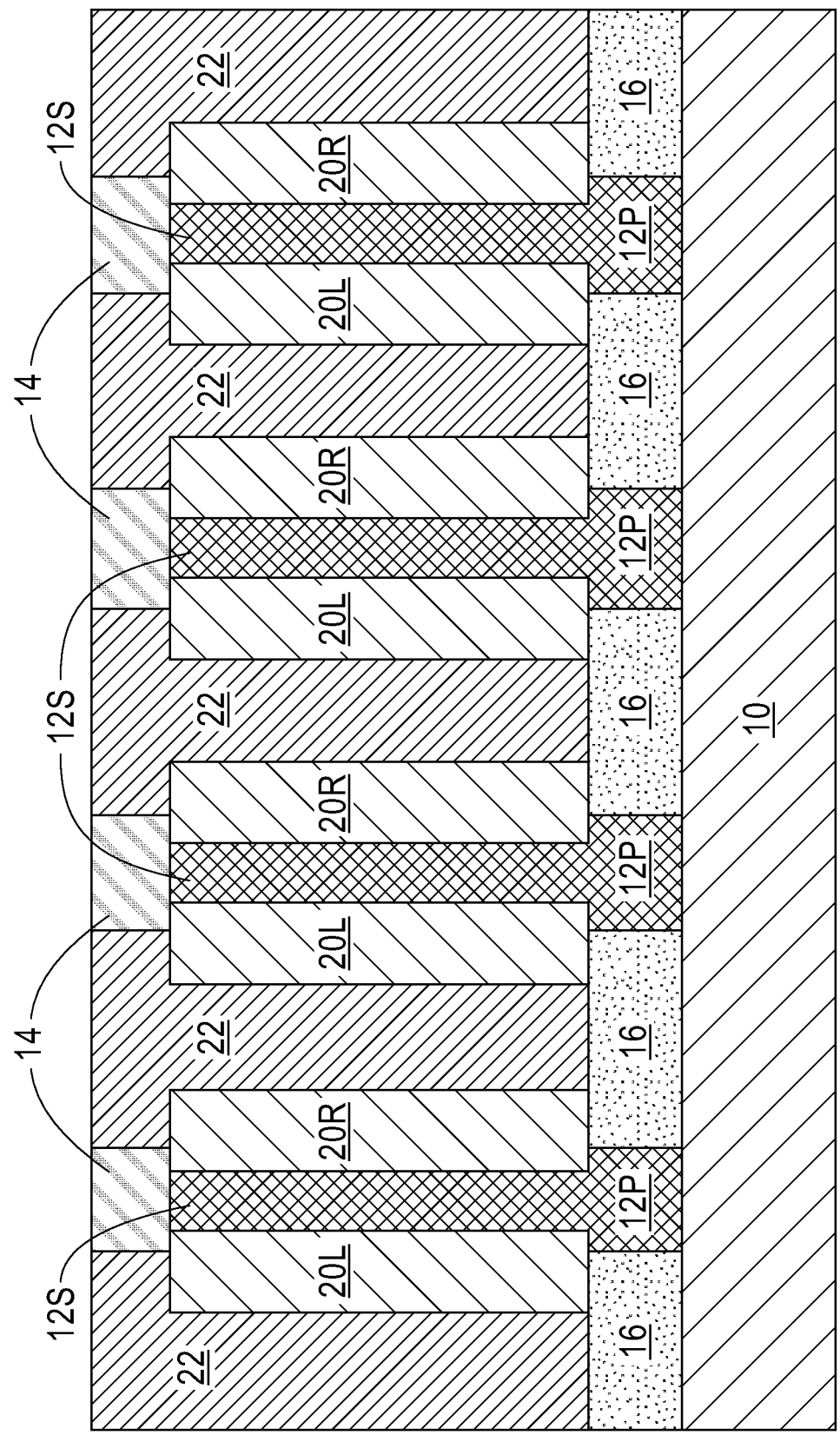
FIG. 6 is a cross sectional view of the exemplary semiconductor structure of FIG. 5 after forming a dielectric material layer surrounding each metal semiconductor pillar and having a topmost surface that is coplanar with a topmost surface of each hard mask cap.

Referring now to FIG. 6, there is illustrated the exemplary semiconductor structure of FIG. 5 after forming a dielectric material layer 22 surrounding each metal semiconductor pillar and having a topmost surface that is coplanar with a topmost surface of each hard mask cap 14. The dielectric material layer 22 is composed of a dielectric material that is different from the hard mask material of each hard mask cap 14. Examples of dielectric materials that can be used to provide dielectric material layer 22 include silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the dielectric material that provides dielectric material layer 22. The use of a self-planarizing dielectric material as the dielectric material that provides the dielectric material layer 22 may avoid the need to perform a subsequent planarizing step.

In one embodiment, the dielectric material layer 22 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as dielectric material layer 22, a planarization process or an etch back process follows the deposition of the dielectric material that provides the dielectric material layer 22.

Figure 7:
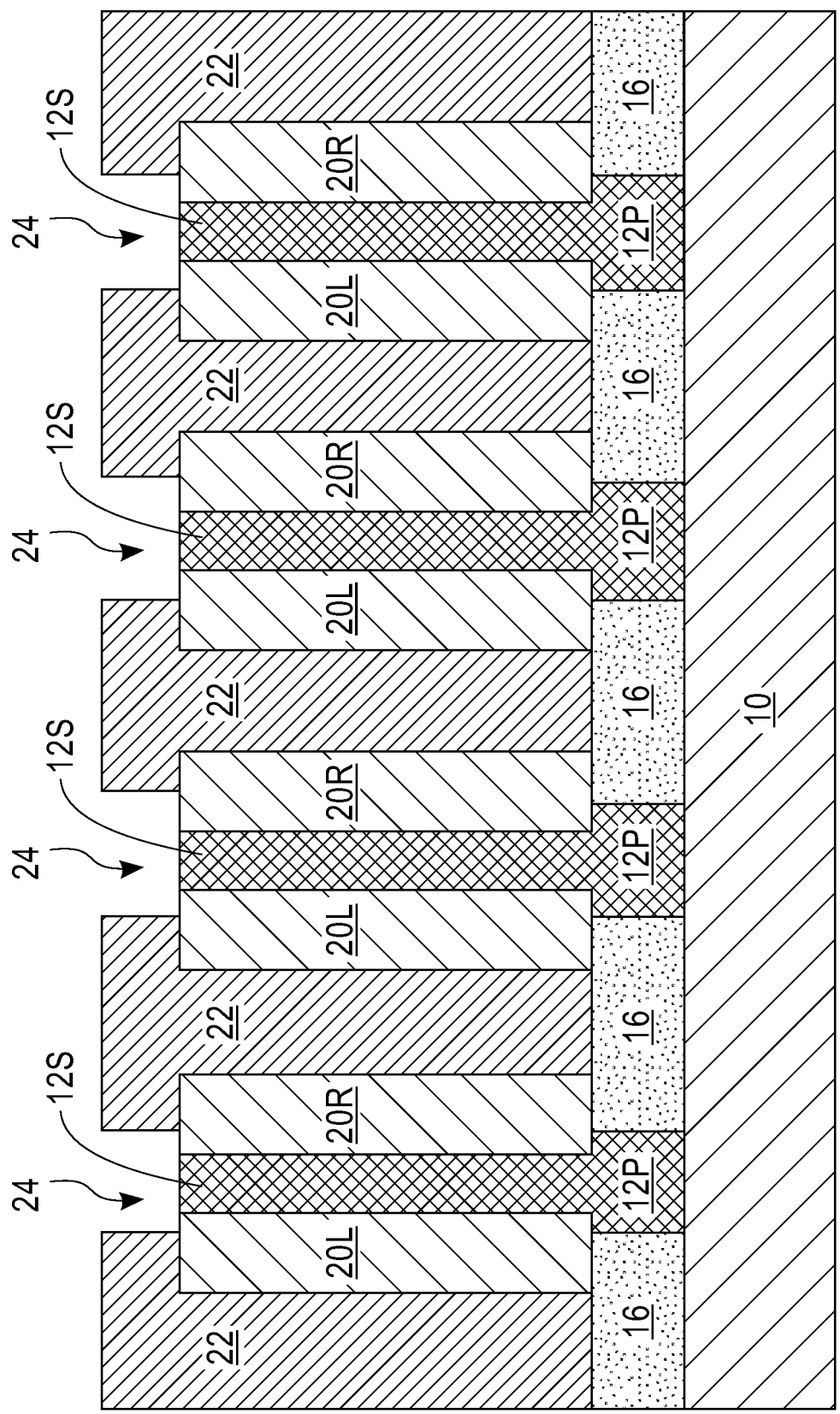
FIG. 7 is a cross sectional view of the exemplary semiconductor structure of FIG. 6 after removing each hard mask cap to provide an opening that physically exposes each semiconductor fin portion that is present between each nearest neighboring pair of metal semiconductor alloy pillars.

Referring now to FIG. 7, there is illustrated the exemplary semiconductor structure of FIG. 6 after removing each hard mask cap 14 to provide an opening 24 that physically exposes the semiconductor fin portion 12S that is present between each nearest neighboring pair of metal semiconductor alloy pillars 20L, 20R. Each hard mask cap 14 is removed utilizing an etching process that is selective in removing the hard mask material that provides each hard mask cap 14. In one example, and when each hard mask cap 14 is composed of silicon nitride, hot (180° C.) phosphoric acid may be used to remove each hard mask cap 14.

Figure 8:
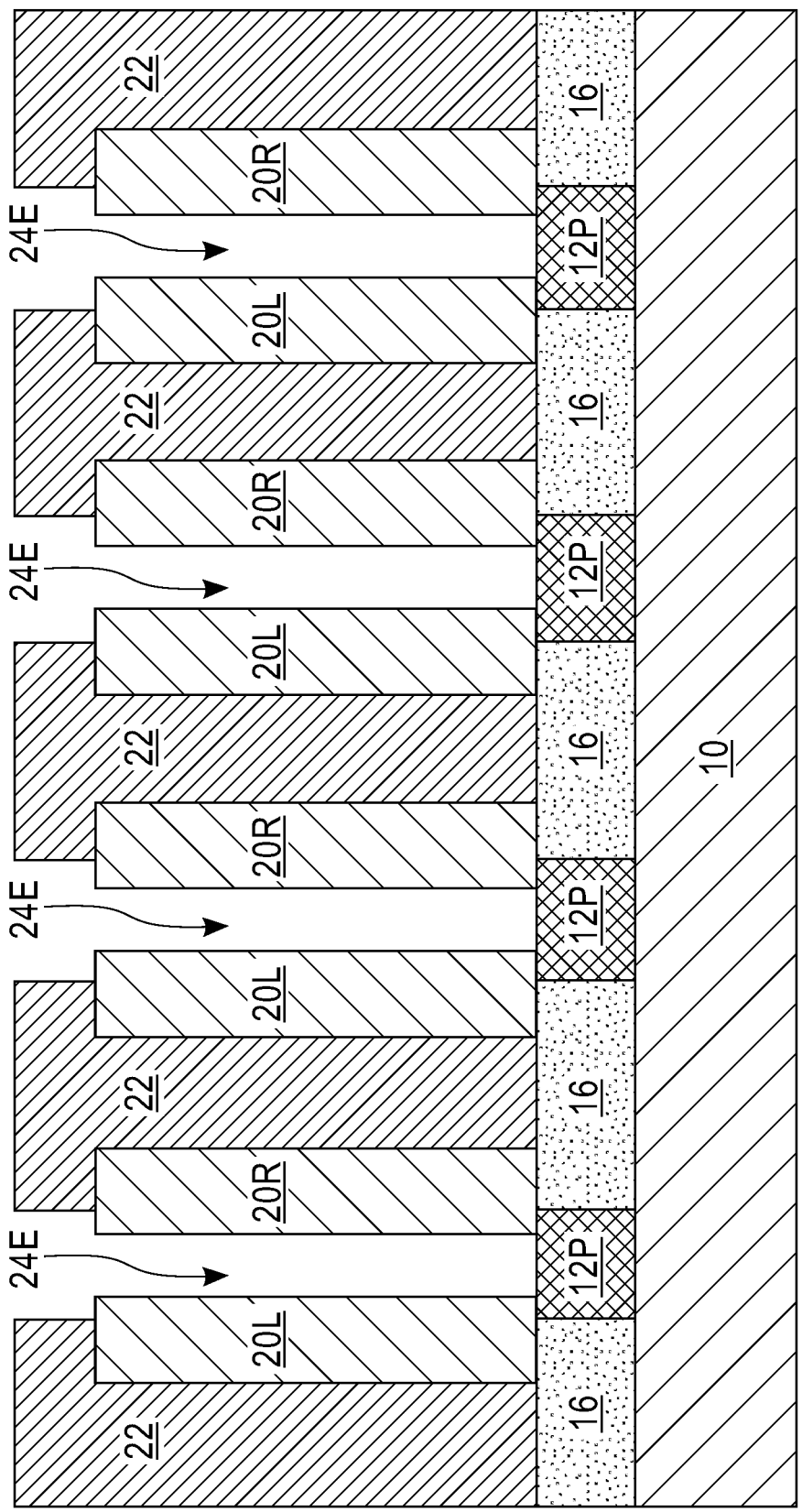
FIG. 8 is a cross sectional view of the exemplary semiconductor structure of FIG. 7 after removing each semiconductor fin portion that is present between each pair of metal semiconductor alloy pillars to physically expose semiconductor fin pedestals.

Referring now to FIG. 8, there is illustrated the exemplary semiconductor structure of FIG. 7 after removing each semiconductor fin portion 12S that is present between each pair of metal semiconductor alloy pillars 20L, 20R to physically expose the semiconductor fin pedestals 12P. In FIG. 8, element 24E denotes an extended opening that is formed by this step of the present application. The removal of each semiconductor fin portion 12S may be performed utilizing an etching process (wet or dry) that is selective in removing the semiconductor material that provides each semiconductor fin portion 12S.

Figure 9A:
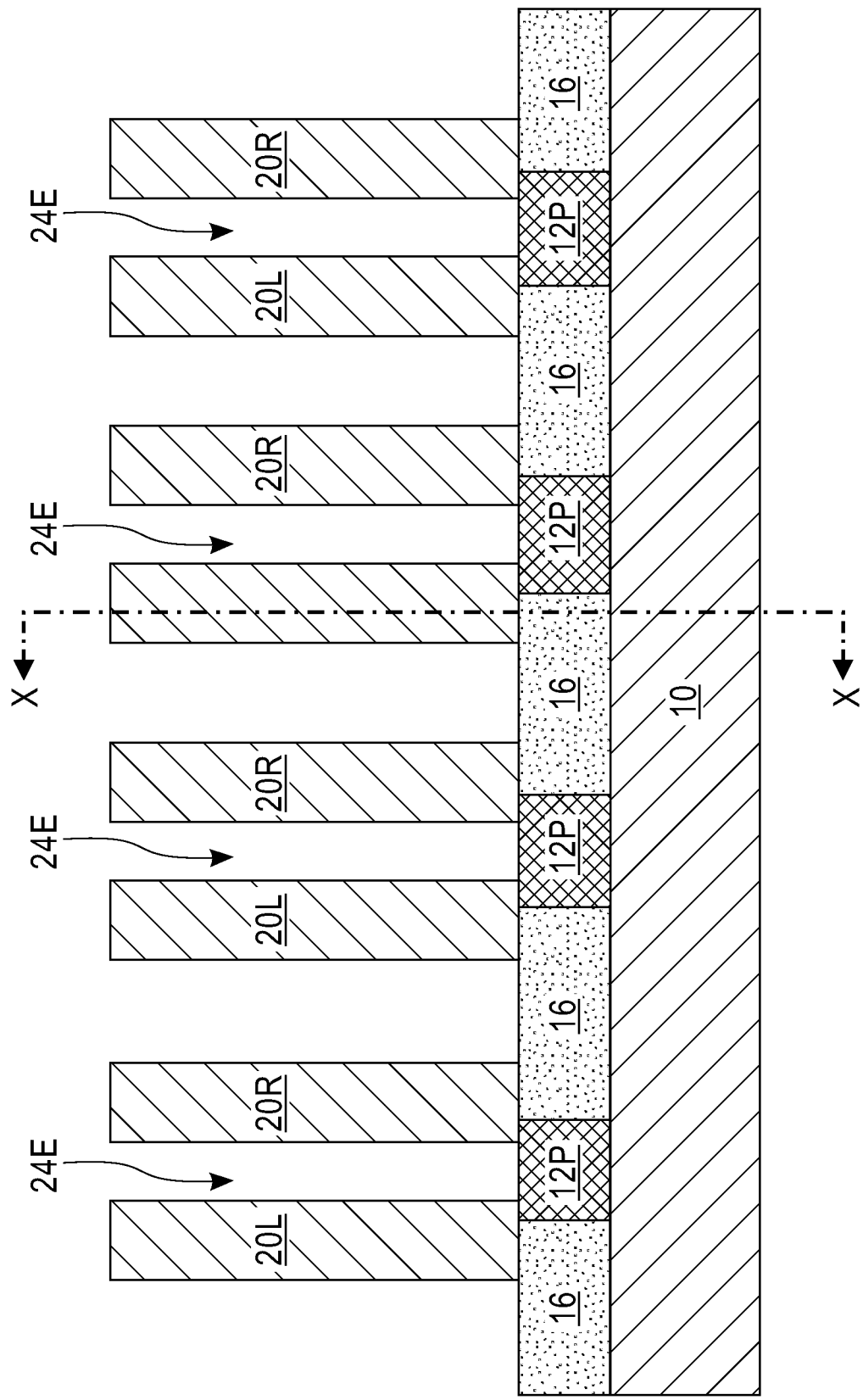
FIG. 9A is a cross view of the exemplary semiconductor structure of FIG. 8 after removing the dielectric material layer from the device area containing the metal semiconductor alloy pillars.
Figure 9B:
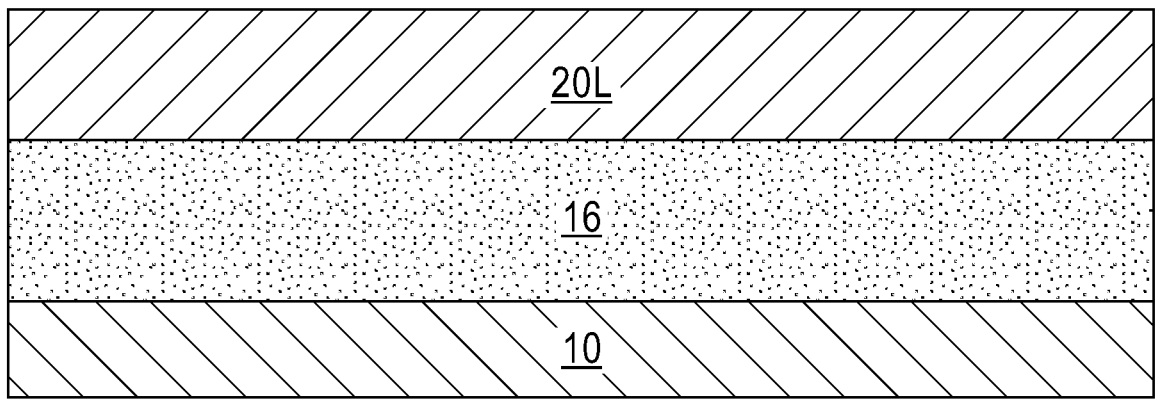
FIG. 9B is a cross sectional view of the exemplary structure of FIG. 9A through line X-X.

Referring now to FIG. 9A, there is illustrated the exemplary semiconductor structure of FIG. 8 after removing the dielectric material layer 22 from the device region including the metal semiconductor alloy pillars 20L, 20R. The dielectric material layer 22 may be removed from the device region including the metal semiconductor alloy pillars 20L, 20R utilizing an etching process that is selective in removing the dielectric material that provides the dielectric material layer 22. FIG. 9B illustrates the exemplary structure of FIG. 9A through line X-X.

Figure 10:
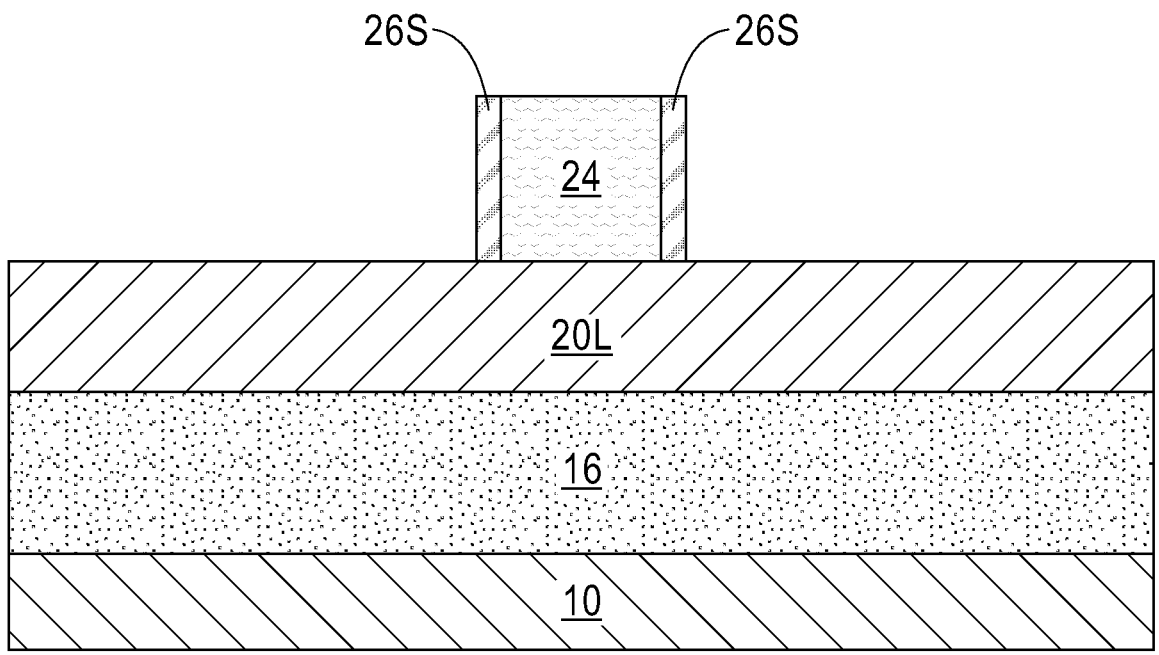
FIG. 10 is a cross sectional view of FIG. 9B after forming a sacrificial gate structure and a gate spacer.

Referring now to FIG. 10, there is illustrated the exemplary structure of FIG. 9B after forming a sacrificial gate structure 24 and a gate spacer 26S. In the illustrated cross sectional view which is through one of the metal semiconductor alloy pillars, i.e., metal semiconductor alloy pillar 20L, the sacrificial gate structure 24 and the gate spacer 26S are located on metal semiconductor alloy pillar 20L. It is noted that other sacrificial gate structures and gate spacers are formed on the other metal semiconductor alloy pillars shown in FIG. 9A.

The sacrificial gate structure 24 and the gate spacer 26S, which are located on metal semiconductor alloy pillar 20L, straddle over the metal semiconductor alloy pillar 20L. By "straddling" it is meant that a first portion of a first material is located on one side of a second material, and another portion of the first material is located on another side of the second material, and wherein yet a further portion of the first material is present above a topmost surface of the second material. So not to obscure the present application, the drawings only show the sacrificial gate structure 24 and the gate spacer 26S on a topmost surface of metal semiconductor alloy pillar 20L.

The sacrificial gate structure 24 may include a single sacrificial material layer or a stack of two or more sacrificial materials (i.e., at least one sacrificial material portion). In one embodiment (not shown), the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and etching. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, or atomic layer deposition (ALD).

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of said sacrificial materials), lithography and etching can be used to pattern the sacrificial material stack (or any subset of said sacrificial materials) and to provide the sacrificial gate structure 24. The remaining portion of the sacrificial gate dielectric material constitutes a sacrificial gate dielectric portion, the remaining portion of the sacrificial gate material constitutes a sacrificial gate portion, and the remaining portion of the sacrificial dielectric cap material constitutes a sacrificial dielectric cap portion.

After providing the sacrificial gate structure 24, a gate spacer 26S can be formed on exposed sidewall surfaces of the sacrificial gate structure 24; the gate spacer 26S is formed around the entire sidewalls of the sacrificial gate structure 24. The gate spacer 26S can be formed by first providing a dielectric spacer material and then etching the dielectric spacer material. Examples of dielectric spacer materials that may be employed in the present application include dielectric oxides, dielectric nitrides and/or dielectric oxynitrides. Alternatively, the dielectric spacer material that provides gate spacer 26S may be a dielectric material having a dielectric constant of less than silicon dioxide; a dielectric material having a dielectric constant of less than silicon dioxide can be referred to as a low k dielectric material. In one example, SiBCN may be used as a low k dielectric material that can provide gate spacer 26S. The dielectric spacer material may be provided by a deposition process including, for example, chemical vapor deposition (CVD), plasma enhanced chemical vapor deposition (PECVD), or physical vapor deposition (PVP). The etch used to provide the gate spacer 26S may comprise a dry etching process such as, for example, reactive ion etching.

Figure 11:
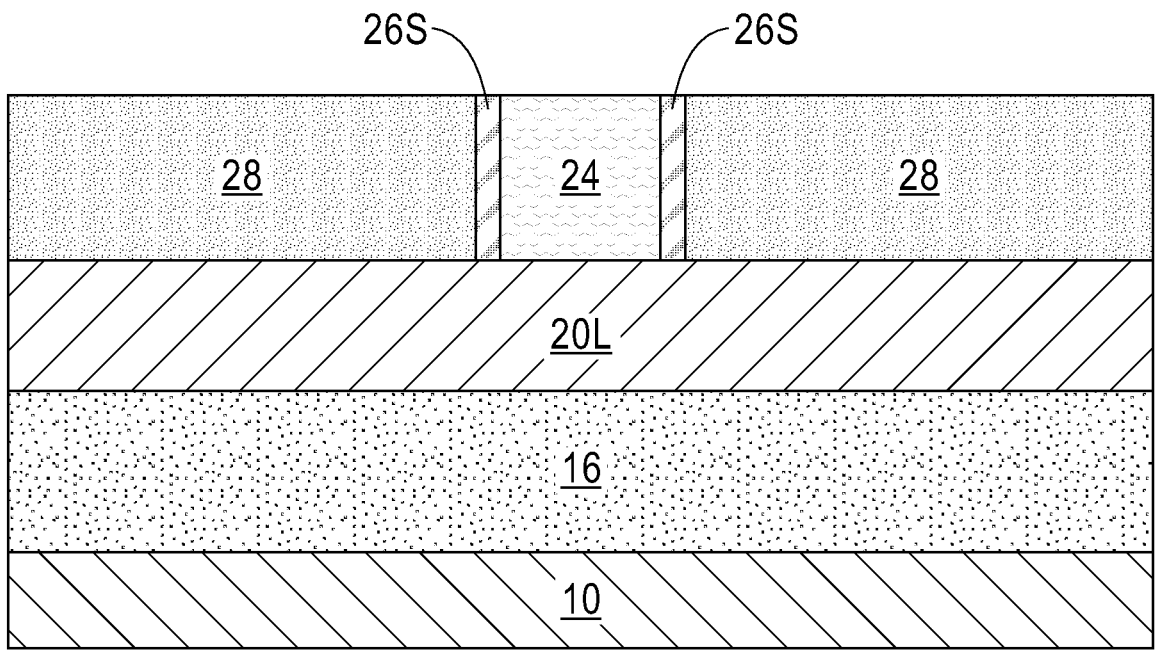
FIG. 11 is a cross sectional view of the exemplary semiconductor structure of FIG. 10 after forming an interlayer dielectric material layer.

Referring now to FIG. 11, there is illustrated the exemplary semiconductor structure of FIG. 10 after forming an interlayer dielectric material layer 28. As is illustrated, the interlayer dielectric material layer 28 has a topmost surface that is coplanar with a topmost surface of the sacrificial gate structure 24 and the gate spacer 26S.

The interlayer dielectric material layer 28 is composed of a dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. In another embodiment, a self-planarizing material such as a spin-on glass (SOG) or a spin-on low-k dielectric material such as SiLK™ can be used as the dielectric material that provides the interlayer dielectric material layer 28. The use of a self-planarizing dielectric material as the dielectric material that provides the interlayer dielectric material layer 28 may avoid the need to perform a subsequent planarizing step.

In one embodiment, the interlayer dielectric material layer 28 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the interlayer dielectric material layer 28, a planarization process or an etch back process follows the deposition of the dielectric material that provides the interlayer dielectric material layer 28.

Figure 12:
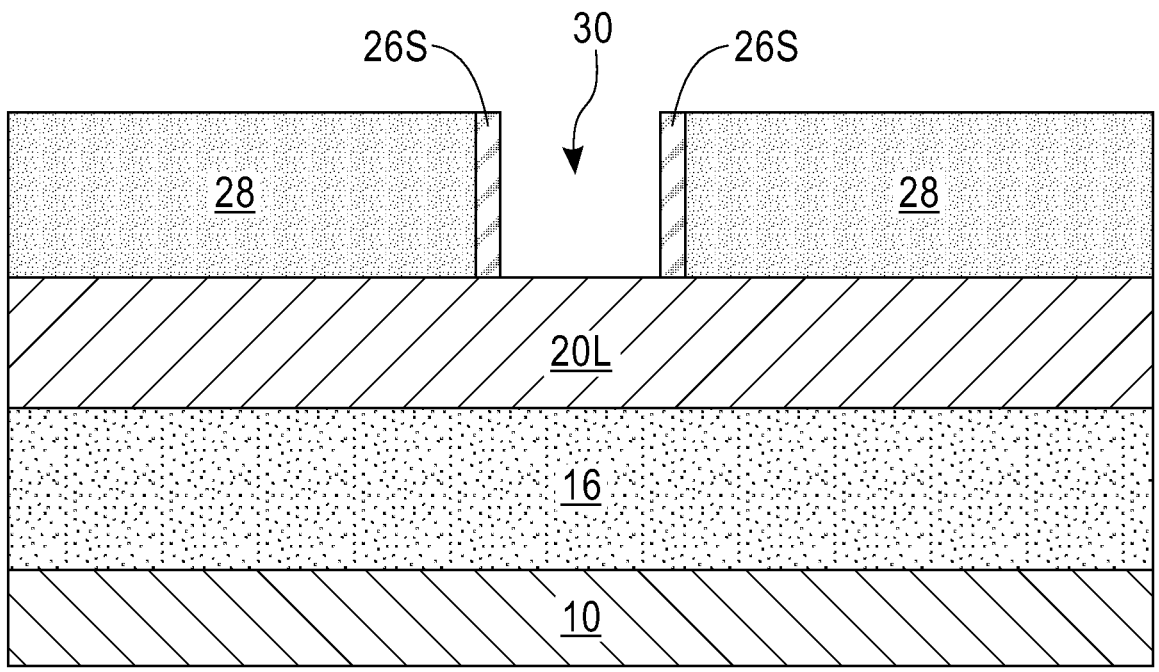
FIG. 12 is a cross sectional view of the exemplary semiconductor structure of FIG. 11 after removing the sacrificial gate structure to provide a cavity.

Referring now to FIG. 12, there is illustrated the exemplary semiconductor structure of FIG. 11 after removing the sacrificial gate structure 24 to provide a cavity 30. The removal of the sacrificial gate structure 24 can be performed utilizing one or more anisotropic etching processes that is selective in removing the material (or materials) that provide the sacrificial gate structure 24. At this point of the present application, functional gate structures (not shown) may be formed in areas in which transistor devices are to be formed. As known to those skilled in the art, functional gate structures include a gate dielectric material and gate conductor.

Figure 13A:
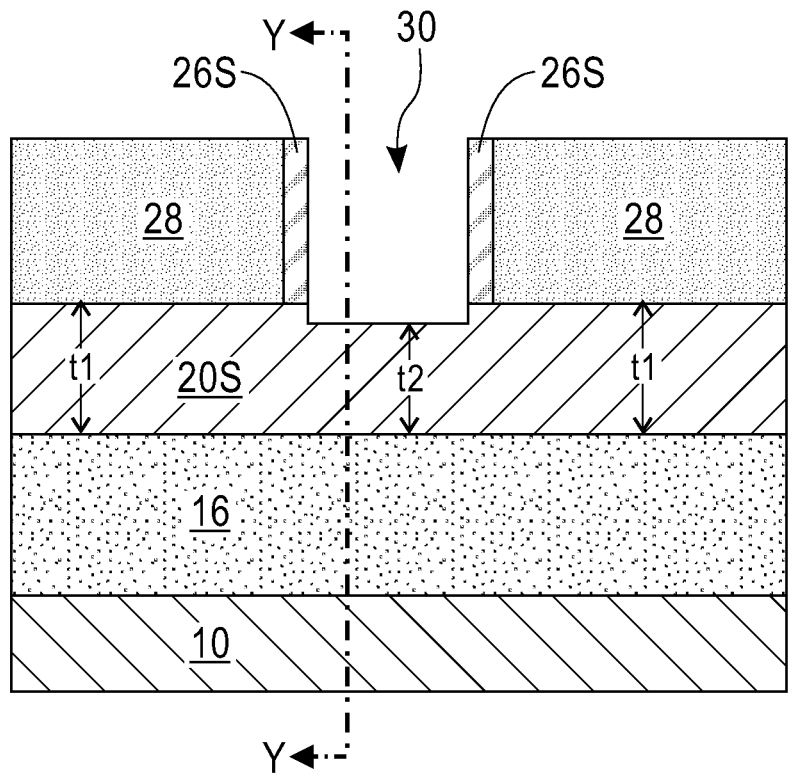
FIG. 13A is a cross sectional view of the exemplary semiconductor structure of FIG. 12 after trimming metal semiconductor alloy pillars that are physically exposed by the cavity.
Figure 13B:
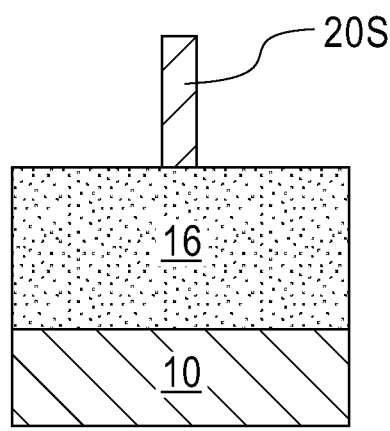
FIG. 13B is a cross sectional view of the exemplary semiconductor structure of FIG. 13A through line Y-Y.

Referring now to FIG. 13A, there is illustrated the exemplary semiconductor structure of FIG. 12 after trimming metal semiconductor alloy pillars 20L, 20R that are physically exposed by each cavity 30; FIG. 13B illustrates a cross sectional view of the exemplary semiconductor structure of FIG. 13A through line Y-Y. In FIGS. 13A-13B, element 20S demotes a trimmed metal semiconductor alloy pillar which includes end portions having a first thickness, t1, and a middle portion connected to each end portion having a second thickness, t2 that is less than the first thickness. The trimmed metal semiconductor alloy pillar 20S has a dog bone shape. The trimmed metal semiconductor alloy pillar 20S may be referred to herein as a fuse (or FinFET fuse).

The trimming of metal semiconductor alloy pillars 20L, 20R may be performed utilizing a selective etching process. For example, a mixture of hydrogen peroxide and sulfuric acid or nitric acid. Alternatively, a plasma oxidation followed by etching may be used to trim the metal semiconductor alloy pillars 20L, 20R. Further, a reactive ion etching process may be used to perform metal semiconductor alloy pillar trimming.

Figure 14:
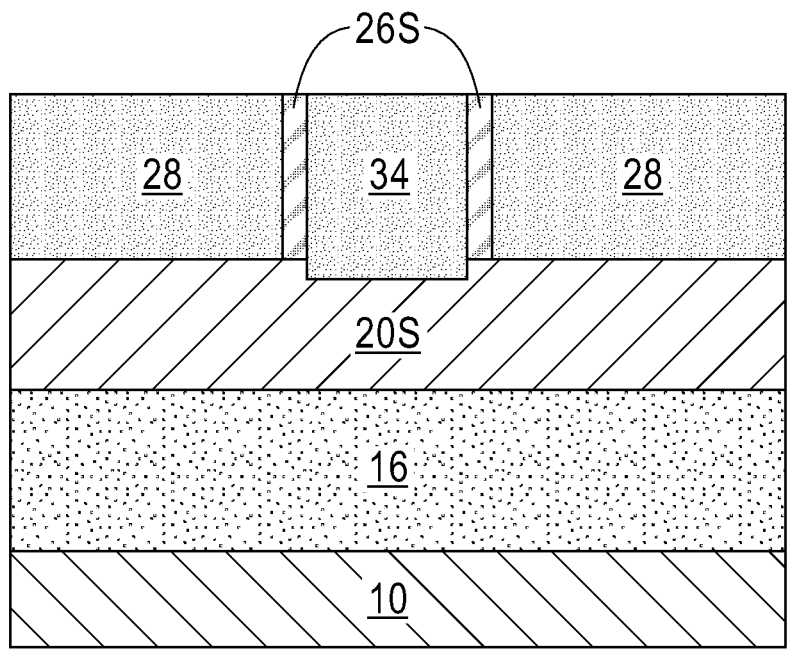
FIG. 14 is a cross sectional view of the exemplary semiconductor structure of FIG. 13A after forming another interlayer dielectric material layer in the cavity and upon the trimmed portion of each metal semiconductor alloy pillar.

Referring now to FIG. 14, there is illustrated the exemplary semiconductor structure of FIG. 13A after forming another interlayer dielectric material layer 34 in the cavity 30 and upon the trimmed portion of each metal semiconductor alloy pillar, i.e., trimmed metal semiconductor alloy pillar 20S. The another interlayer dielectric material layer 34 may include one of the dielectric material mentioned above for interlayer dielectric material layer 28. In one embodiment, the dielectric material that provides the another interlayer dielectric material layer 34 is the same as the dielectric material that provides interlayer dielectric material layer 28. In another embodiment, the dielectric material that provides the another interlayer dielectric material layer 34 has a different composition than the dielectric material that provides interlayer dielectric material layer 28. The another interlayer dielectric material layer 34 may be formed utilizing one of the techniques mentioned above for forming interlayer dielectric material layer 28. In the present application, the interlayer dielectric material layer 28 may be referred to as a first interlayer dielectric material layer, while the interlayer dielectric material layer 34 may be referred to as a second interlayer dielectric material layer.

Figure 15A:
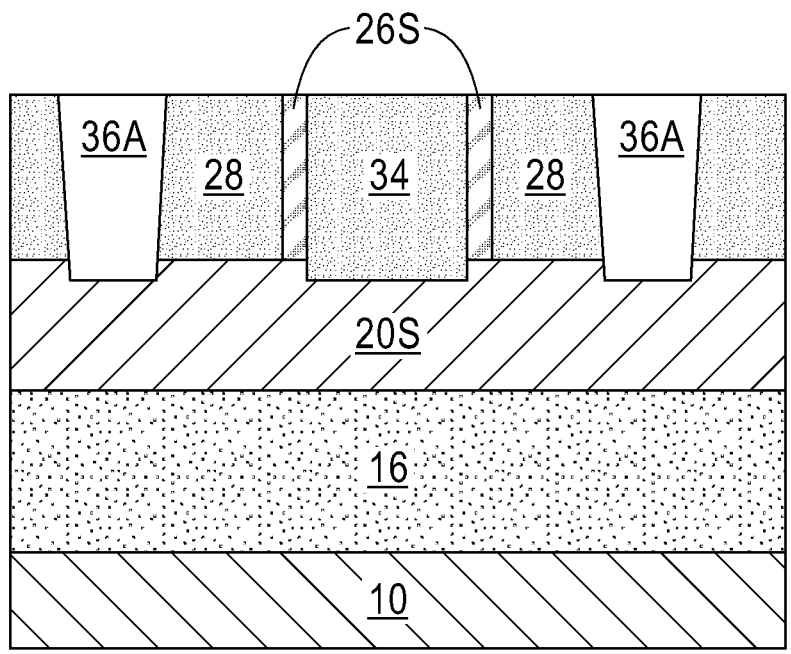
FIG. 15A is a cross sectional view of the exemplary semiconductor structure of FIG. 14 after forming first and second metal contact structures.

Referring now to FIG. 15A, there is illustrated the exemplary semiconductor structure of FIG. 14 after forming first and second metal contact structures 36A, 36B; additional contact structures can be formed. As is shown in FIG. 15A, first metal contact structure 36A contacts a surface of one end portion of the trimmed metal semiconductor alloy pillar 20S, while the second metal contact structure 36B contacts a surface of the other end portion of the trimmed metal semiconductor alloy pillar 20S.

Figure 15B:
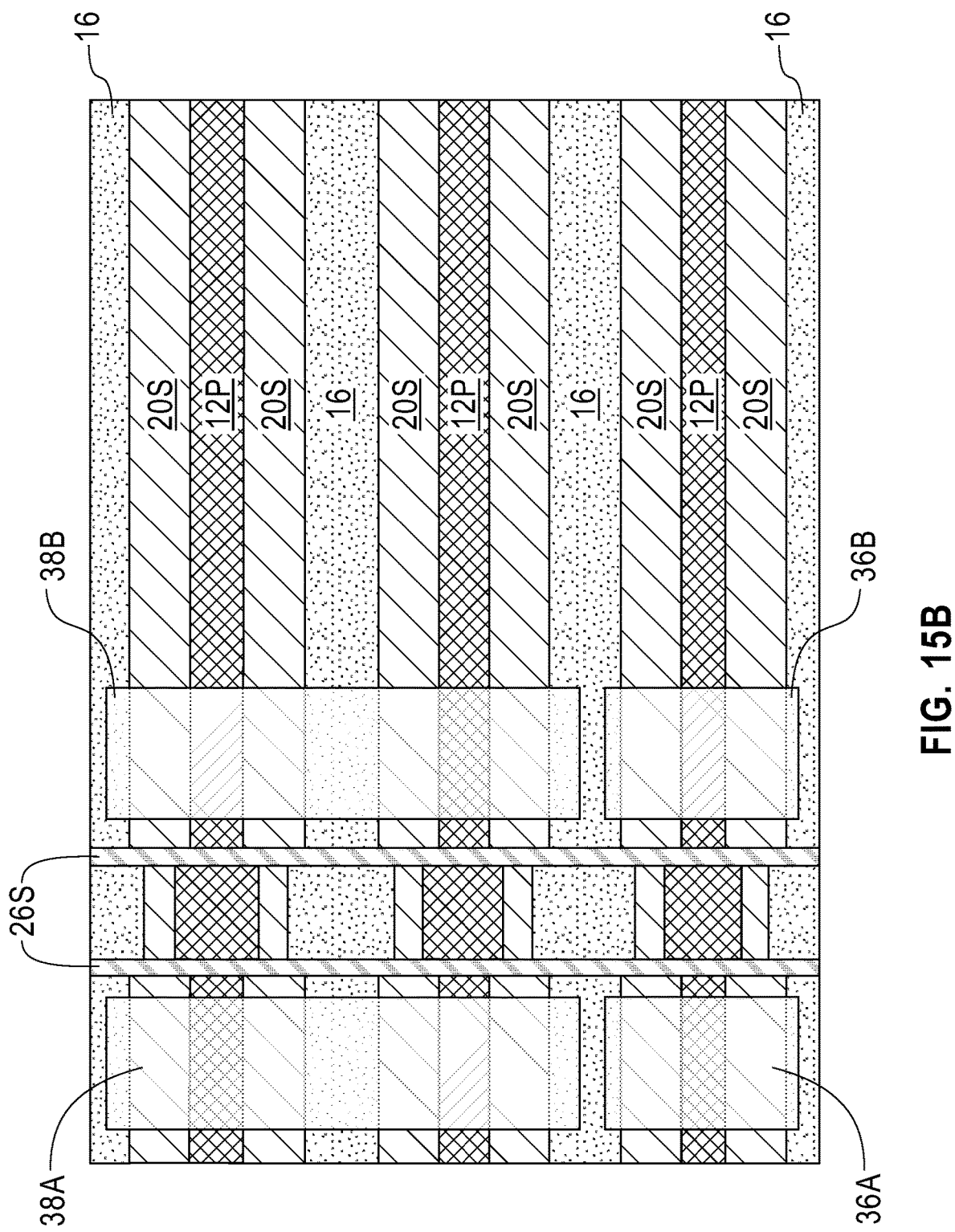
FIG. 15B is a top down view of the exemplary semiconductor structure shown in FIG. 15A.

The first and second metal contact structures 36A, 36B are formed by first providing a contact opening that extends entirely through the interlayer dielectric material layer 28 and exposes opposing end portions of the trimmed metal semiconductor alloy pillar 20S. Next, each contact opening is filled with a contact metal or contact metal alloy such as, for example, copper (Cu), aluminum (Al), tungsten (W), cobalt (Co) or alloys thereof such as a cooper-aluminum alloy. The filling of each contact opening may be performed by a deposition process such as, for example, chemical vapor deposition (CVD), plasma enhanced chemical vapor deposition (PECVD), sputtering, or plating. In some embodiments, a planarization process such as, for example, chemical mechanical planarization may follow the deposition of the contact metal or contact metal alloy so as to provide the first and second contact structures 36A, 36B. Referring to FIG. 15B, there is illustrated a top down view of the exemplary semiconductor structure shown in FIG. 15A. As is shown in FIG. 15B, multiple first and second contact structures are shown, each contacting a different number of trimmed metal semiconductor alloy pillars 20S. In FIG. 15B, element Si denotes a set of set of spaced apart first and second fuses comprises a metal semiconductor alloy pillar 20S having a first end portion and a second end portion having a first thickness, and a middle portion located between the first and second end portions and having a second thickness that is less than the first thickness. Element S2 and element S3 designate additional sets of fuses that can be present in the structure.

Notably, FIGS. 15A and 15B collectively illustrate a semiconductor structure in accordance with the present application which includes a set of spaced apart first and second fuses, e.g., Si, present partially on a semiconductor fin pedestal 12P and partially on an isolation layer 14 that is laterally adjacent the semiconductor fin pedestal 12P. Each of the first and second fuses comprises a metal semiconductor alloy pillar 20S having a first end portion and a second end portion having a first thickness, and a middle portion located between the first and second end portions and having a second thickness that is less than the first thickness. A first contact structure 36A is contacting a surface of the first end portion of each metal semiconductor alloy pillar 20S of the set of spaced apart first and second fuses, e.g., S1, and a second contact structure 36B is contacting a surface of the second end portion of each metal semiconductor alloy pillar 20S of the set of spaced apart first and second fuses, e.g., S1.

The structure may include at least one additional set of spaced apart first and second fuses (e.g., S2, S3), wherein each of the first and second fuses of the at least one additional set of spaced apart first and second fuses (e.g., S2, S3) comprises a metal semiconductor alloy pillar 20S having a first end portion and a second end portion having a first thickness, and a middle portion located between the first and second end portions and having a second thickness that is less than the first thickness. The first and second fuses of the at least one additional set of spaced apart first and second fuses (e.g., S2, S3) are present partially on another semiconductor fin pedestal 12P and partially on the isolation layer 14 that surrounds the another semiconductor fin pedestal 12P. In some embodiments, a third contact structure 38A may contact a surface of the first end portion of each metal semiconductor alloy pillar 20S of the at least one additional set of spaced apart first and second fuses (e.g., S2, S3), and a fourth contact structure 38B that may contact a surface of the second end portion of each metal semiconductor alloy pillar 20S of the at least one additional set of spaced apart first and second fuses (e.g., S2, S3). In some embodiments, the third contact structure 38A is spaced apart from the first contact structure 36A and the fourth contact structure 38B is spaced apart from the second contact structure 36B. The third and fourth contact structures can be formed and include materials described above for the first and second contact structures.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
   forming at least one semiconductor fin extending upward from a semiconductor substrate, wherein the at least one semiconductor fin has a hard mask cap located on a surface thereof;
   forming an isolation layer on a physically exposed surface of the semiconductor substrate and contacting opposing sidewall surfaces of a lower portion of the at least one semiconductor fin;
   forming a metal semiconductor alloy pillar within a portion of each of the opposing sidewall surfaces of the at least one semiconductor fin, wherein a semiconductor fin portion remains between each metal semiconductor alloy pillar;
   removing both the hard mask cap and the semiconductor fin portion;
   forming a sacrificial gate structure and a gate spacer on each metal semiconductor alloy pillar;
   forming an interlayer dielectric material layer laterally surrounding the gate spacer;
   removing the sacrificial gate structure to provide a cavity that physically exposes a portion of each metal semiconductor alloy pillar; and
   trimming the physically exposed portion of each metal semiconductor alloy pillar to provide a pair of spaced apart fuses, each fuse having a first end portion and a second end portion having a first thickness, and a middle portion located between the first and second end portions and having a second thickness that is less than the first thickness.

2. The method of claim 1, further comprising forming another interlayer dielectric material layer within the cavity and on the middle portion of each fuse.

3. The method of claim 1, further comprising forming a first contact structure contacting a surface of the first end portion of each of the fuses, and a second contact structure contacting a surface of the second end portion of each of the fuses.

4. The method of claim 3, wherein the forming of the first contact and structure the second contact structure comprises:
   forming a contact openings that extend entirely through the interlayer dielectric material layer; and
   filling the contact openings with a contact metal or contact metal alloy.

5. The method of claim 1, wherein the forming the metal semiconductor alloy pillars comprises:
   forming a metal semiconductor alloy forming metal alloy; and
   performing an anneal.

6. The method of claim 1, wherein after forming of the metal semiconductor alloy pillar, a semiconductor fin pedestal is present beneath the semiconductor fin portion and laterally between the isolation layer.

7. The method of claim 6, wherein the semiconductor fin pedestal has a topmost surface that is coplanar with a topmost surface of the isolation layer.

8. The method of claim 6, wherein each fuse is present partially on the semiconductor fin pedestal and partially on the isolation layer.

9. The method of claim 1, wherein the fuses are spaced apart by a pitch from 5 nm to 50 nm.

10. The method of claim 1, wherein each of the metal semiconductor alloy pillars is composed of a metal silicide or a metal germanide.

11. The method of claim 1, wherein each of the metal semiconductor alloy pillars has a height that is less than a height of the at least one semiconductor fin.

12. The method of claim 1, further comprising forming, prior to the removing of the semiconductor fin portion, a dielectric material layer laterally adjacent to each of the metal semiconductor alloy pillars.

13. The method of claim 12, further comprising removing the dielectric material layer between the removing of the semiconductor fin portion and the forming of the sacrificial gate structure.

14. The method of claim 1, wherein each of the fuses has a dog-bone shape.

15. The method of claim 1, wherein the trimming comprises a selective etching process.

16. The method of claim 15, wherein the selective etching process comprises utilizing an etchant that is composed of a mixture of hydrogen peroxide and sulfuric acid.

17. The method of claim 15, wherein the selective etching process comprises utilizing an etchant that is composed of a mixture of hydrogen peroxide and nitric acid.

18. The method of claim 1, wherein the trimming comprises plasma oxidation and etching.

19. The method of claim 1, wherein the metal semiconductor alloy portion is composed of a metal and a same semiconductor material as the at least one semiconductor fin.

20. The method of claim 19, wherein the metal is selected from the group consisting of nickel, platinum, palladium, titanium, tungsten, and cobalt.

* * * * *